United States Patent
Yamaguchi et al.

(10) Patent No.: US 8,642,886 B2
(45) Date of Patent: Feb. 4, 2014

(54) SEAL STRUCTURE, ELECTRONIC DEVICE, PORTABLE DEVICE, AND SEAL METHOD

(75) Inventors: Shingo Yamaguchi, Kawasaki (JP); Satoshi Watanabe, Kawasaki (JP); Kohei Choraku, Kawasaki (JP); Shigehiro Fujii, Kato (JP); Katsumi Adachi, Kato (JP); Yoshito Fukata, Kato (JP)

(73) Assignee: Fujitsu Limited, Kawasaki (JP)

( * ) Notice: Subject to any disclaimer, the term of this patent is extended or adjusted under 35 U.S.C. 154(b) by 51 days.

(21) Appl. No.: 13/034,258

(22) Filed: Feb. 24, 2011

(65) Prior Publication Data

US 2011/0209890 A1   Sep. 1, 2011

(30) Foreign Application Priority Data

Feb. 26, 2010   (JP) ................. 2010-042992

(51) Int. Cl.
*H01J 5/00*   (2006.01)
*H01J 15/00*   (2006.01)
*H05K 5/06*   (2006.01)

(52) U.S. Cl.
USPC ............. 174/50.5; 174/50.51; 174/50.62; 174/50.64

(58) Field of Classification Search
USPC ............ 174/50.5, 50.51, 50.56, 50.57, 50.58, 174/50.59, 50.61, 50.62, 50.63, 50.64, 74 R; 277/650; 455/575.1, 575.5, 575.8
See application file for complete search history.

(56) References Cited

U.S. PATENT DOCUMENTS

| | | | |
|---|---|---|---|
| 6,627,817 B1 * | 9/2003 | Kortenbach | 174/74 R |
| 7,307,219 B1 * | 12/2007 | Dower et al. | 174/84 R |
| 2008/0149364 A1 | 6/2008 | Lutsch et al. | |
| 2009/0020962 A1 | 1/2009 | Shinoda et al. | |

FOREIGN PATENT DOCUMENTS

| | | |
|---|---|---|
| JP | 11-501156 A | 1/1999 |
| JP | 2008-047513 A | 2/2008 |
| JP | 2009-026966 A | 2/2009 |
| JP | 2009-188488 A | 8/2009 |
| KR | 10-2009-0009088 A | 1/2009 |
| KR | 10-2009-0015953 A | 2/2009 |
| WO | 96/27279 A1 | 9/1996 |
| WO | 2007/143532 A1 | 12/2007 |

OTHER PUBLICATIONS

Korean Office Action dated Apr. 20, 2012, issued in corresponding Korean Patent Application No. 10-2011-0017433 (English Translation, 9 pages).

Japanese Office Action dated Jun. 18, 2013 issued in Japanese Patent Application No. 2010-042992, w/English translation.

* cited by examiner

*Primary Examiner* — Hoa C Nguyen
*Assistant Examiner* — Binh Tran
(74) *Attorney, Agent, or Firm* — Westerman, Hattori, Daniels & Adrian, LLP

(57) ABSTRACT

In a seal structure sealing a housing for passing a signal line therethrough, the seal structure includes: a first case; a second case joined to the first case to define the housing, and provided with a recess portion through which the signal line passes at a joining surface joining the first case; a first seal member arranged on a bottom surface of the recess portion, and mounting the signal line; a second seal member including a gelatinous composition arranged to cover the signal line arranged on the first seal member; and a third seal member arranged between the first and second cases, and pushing the second case.

8 Claims, 15 Drawing Sheets

SEAL STRUCTURE, ELECTRONIC DEVICE, PORTABLE DEVICE, AND SEAL METHOD

CROSS-REFERENCE TO RELATED APPLICATIONS

This application is based upon and claims the benefit of priority of the prior Japanese Patent Application No. 2010-042992, filed on Feb. 26, 2010, the entire contents of which are incorporated herein by reference.

FIELD

An embodiment discussed herein is related to a seal structure, an electronic device, a portable device, and a seal method.

BACKGROUND

Conventionally, there are various proposals for a seal of a housing through which a signal line such as a flexible cable or a circuit portion passes. For example, a recess step is provided at least one of joining surfaces of first and second housings, and first and second seal members and the signal line or the circuit portion are sandwiched by the first and second housings at the recess step (See Japanese Examined Patent Publication No. 2009-26966). In this proposal, the passing of the signal line and the circuit portion and the maintenance of the hermetic property are achieved by the adherence and flexibility of the first seal member and the stretchability of the second seal member. In such a conventional proposal, the first seal member may be discontinuous foam or include discontinuous foam.

The discontinuous foam has good stretchability in its thickness direction. However, the discontinuous foam has poor stretchability in its width direction. For this reason, when the signal line such as a cable is thick, the deformation of the discontinuous foam may not follow the thickness of the signal line and possibly generate a gap in the seal portion. These days, as for s flat cable as an example of the signal line, multiple flat cables are assumed to be used with being stacked each other. When the multiple flat cables are stacked to increase the entire thickness, the conventional proposal may not ensure a sufficient seal property.

SUMMARY

According to an aspect of the embodiments, a seal structure sealing a housing for passing a signal line therethrough, the seal structure includes: a first case; a second case joined to the first case to define the housing, and provided with a recess portion through which the signal line passes at a joining surface joining the first case; a first seal member having size so as to be located in the recess, arranged on a bottom surface of the recess portion, and mounting the signal line; a second seal member having size so as to be located in the recess, including a gelatinous composition arranged in the recess to cover the signal line arranged on the first seal member; and a third seal member arranged between the first and second cases, and pushing the seal member.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
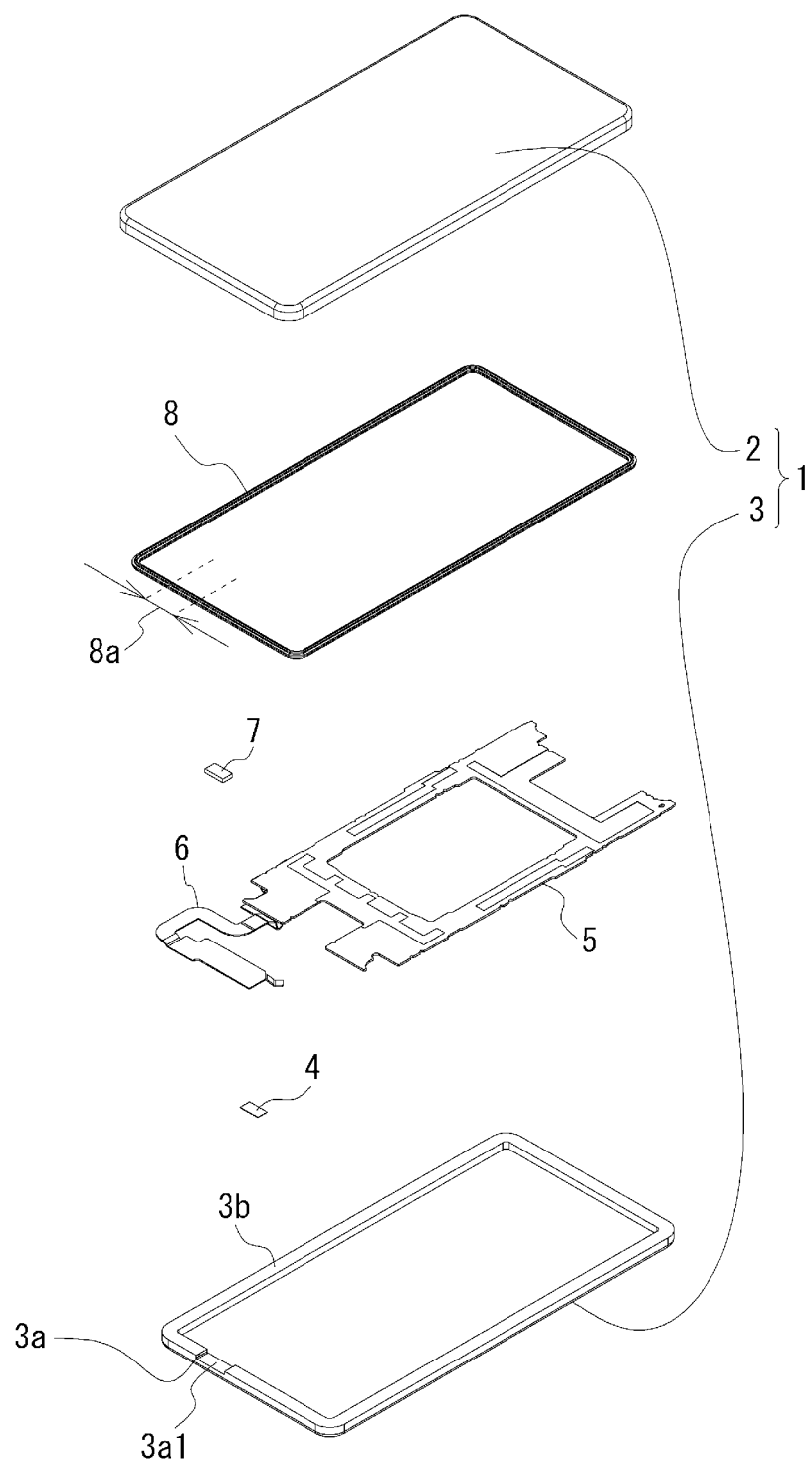
FIG. 1 is an exploded perspective view of a housing including a seal structure according to an embodiment.

The embodiment according to the present invention will be described below with reference to the accompanying drawings. Herein, a ratio and a dimension of each component illustrated in the drawings may be not correspond to the reality. Also, some details may be omitted in the drawings.

Figure 2:
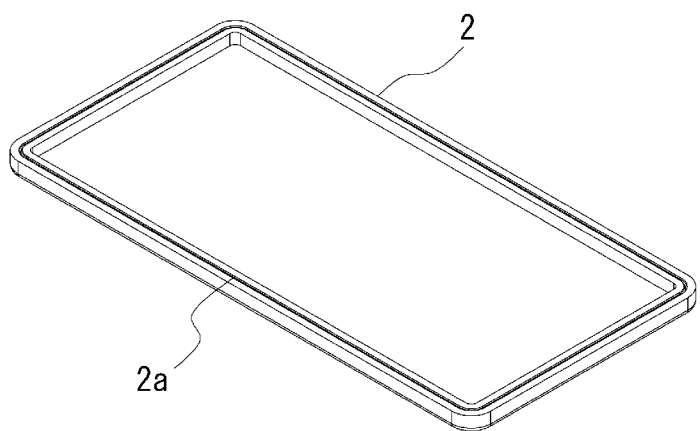
FIG. 2 is a perspective view of a first case according to the embodiment when viewed from its inside.
Figure 3:
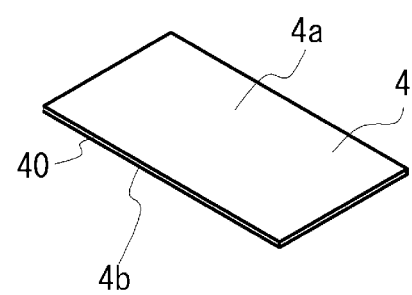
FIG. 3 is an enlarged perspective view of a first seal member according to the embodiment.
Figure 4:
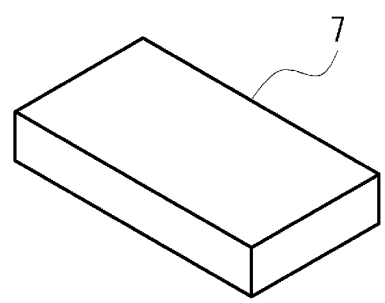
FIG. 4 is an enlarged perspective view of a second seal member according to the embodiment.
Figure 5:
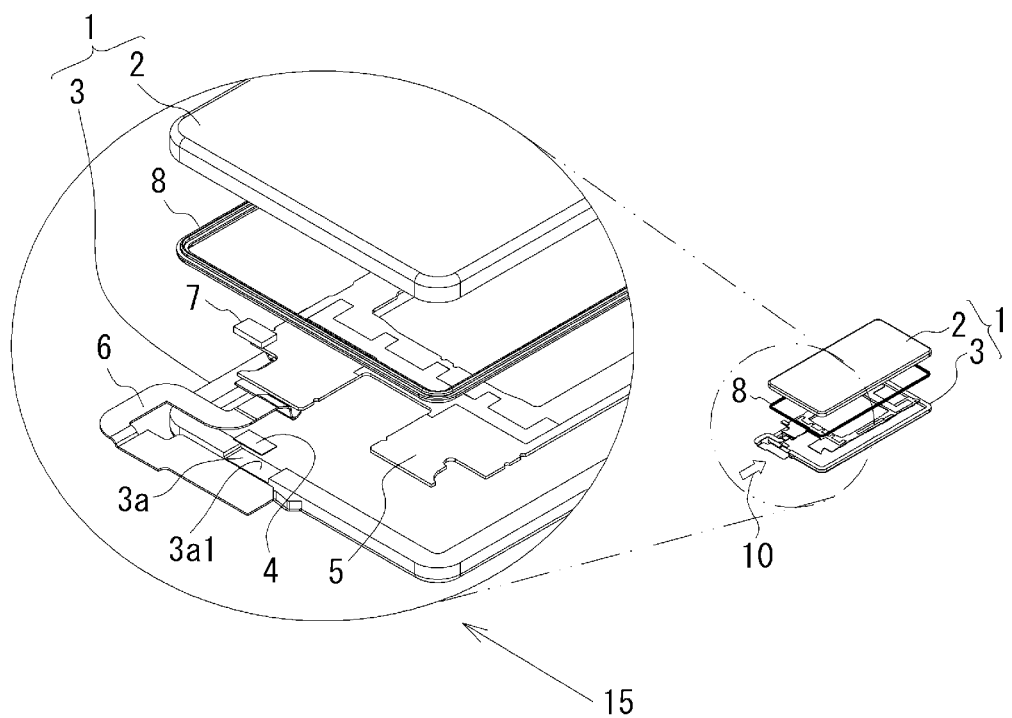
FIG. 5 is an explanatory view of the housing being assembled and illustrates enlarged substantial parts.
Figure 6:
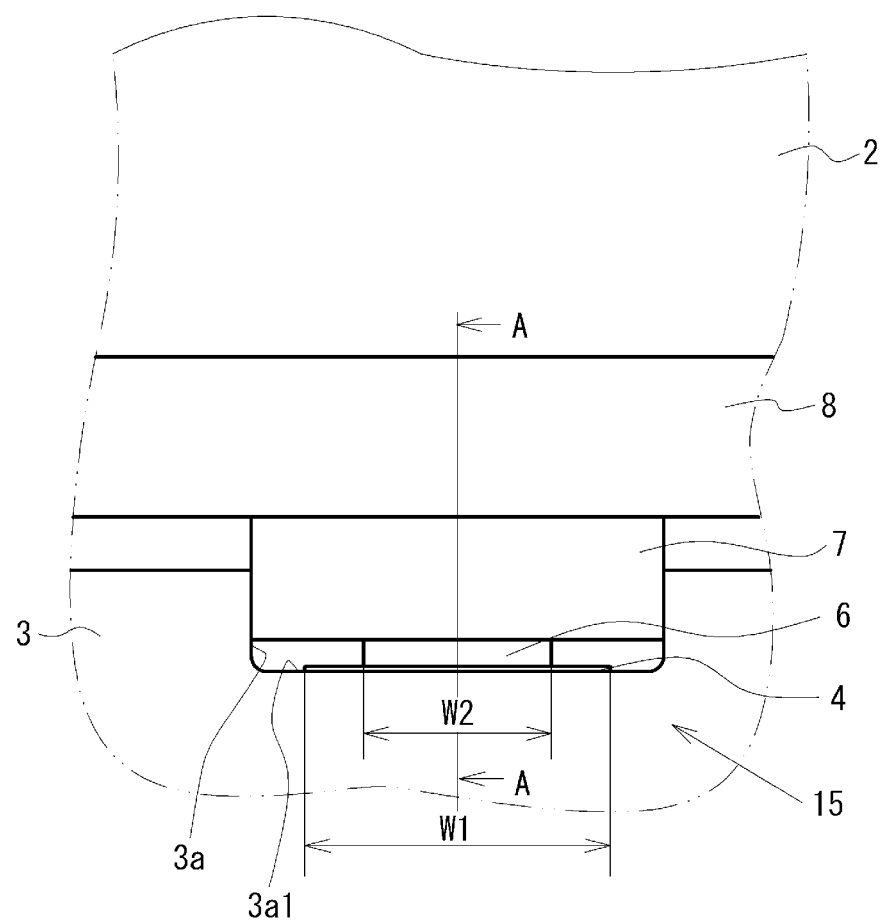
FIG. 6 is an explanatory view of a relationship between elements included in the seal structure according to the embodiment.
Figure 7:
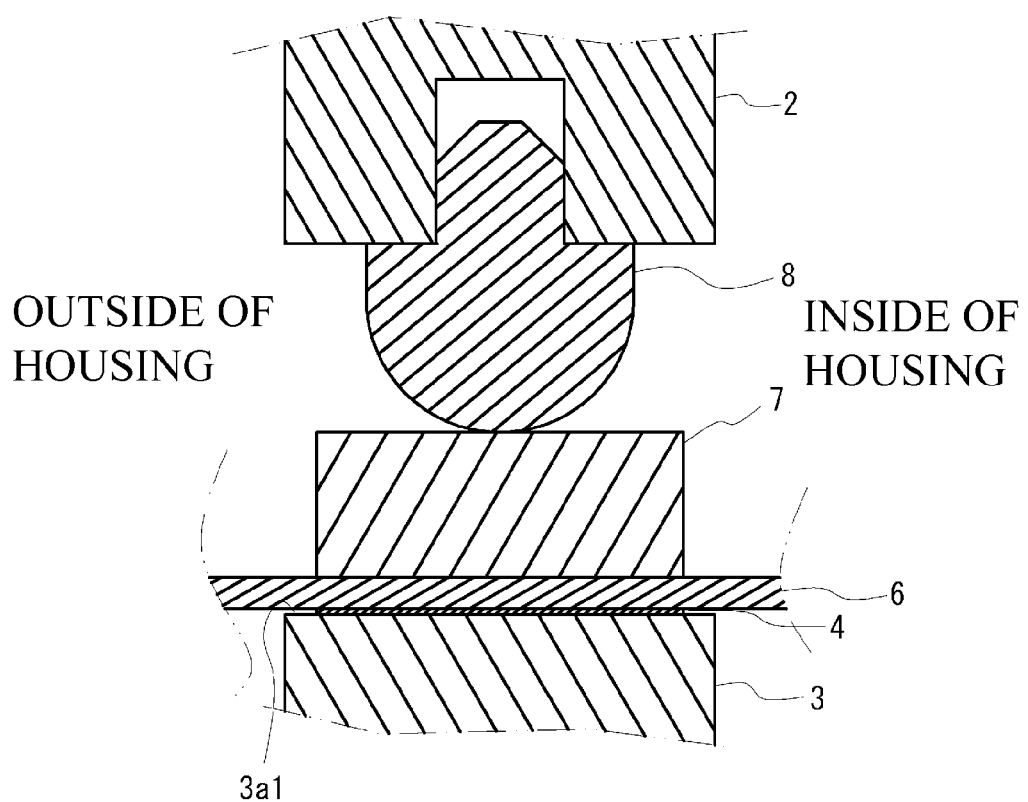
FIG. 7 is a cross-sectional view taken along line A-A of FIG. 6.
Figure 14:
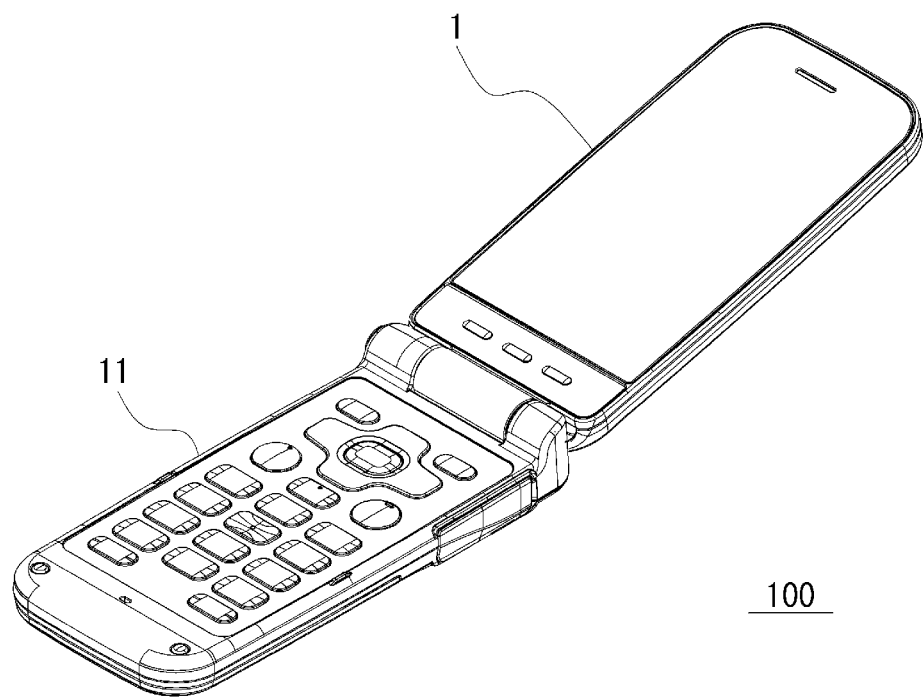
FIG. 14 is a perspective view of a portable telephone.

FIG. 1 is an exploded perspective view of a housing 1 including a seal structure 15 according to an embodiment. The housing 1 defines a single unit of a portable telephone 100 as illustrated in FIG. 14. FIG. 2 is a perspective view of a first case 2 included in the housing 1 when viewed from its inside. FIG. 3 is an enlarged perspective view of a first seal member. FIG. 4 is an enlarged perspective view of a second seal member 7. FIG. 5 is an explanatory view of the housing being assembled and illustrates enlarged substantial parts. FIG. 6 is an explanatory view of a relationship between elements included in the seal structure 15. FIG. 7 is a cross-sectional view taken along line A-A of FIG. 6. FIG. 8 is a view of an example of a method of assembling process of the seal structure 15.

The seal structure 15 seals the housing 1 while allowing a flat cable 6 as an example of a signal line to pass through the housing 1. The seal structure 1 includes first and second cases 2 and 3 as illustrated in FIGS. 1, 5, 6, 8A to 8C. The first and second cases 2 and 3 are combined to define the housing 1. A printed circuit board 5 is housed in the housing 1 as illustrated in FIGS. 1 and 5. The flat cable 6 is connected to the printed circuit board 5. The flat cable 6 is routed from the inside of the housing 1 to the outside thereof.

As illustrated in FIG. 2, the first case 2 includes a groove 2a for attaching a loop gasket 8 thereon. The loop gasket 8 is a third seal member as will be described later. The second case 3 includes a recess portion 3a through which the flat cable 6 passes. Also, the second case 3 includes a joining surface 3b abutting the first case 2. This joining surface 3b is a flat smooth one.

The seal structure 15 includes a double-stick tape 4 arranged at a bottom surface 3a1 of the recess portion 3a. The double-stick tape 4 is an example of a first seal member. The first seal member may fix the flat cable 6 to the second case 3. For this reason, an adhesive may be used. However, the double-stick tape 4 may be used. The double-stick tape 4 includes: an adhesive layer 4a on a front surface of a base material 40 made of discontinuous foam; and an adhesive layer 4b on a back surface thereof, and has a substantially uniform thickness. Herein, the discontinuous foam means that the inner bubbles are discontinuous, and is able to prevent water from passing therethrough. One surface of the double-stick tape 4 adheres on the bottom surface 3a1 of the recess portion 3a, and the other surface of the double-stick tape 4 adheres on the flat cable 6.

The seal structure 15 includes the second seal member 7 which is arranged to cover the flat cable 6 placed on the double-stick tape 4. The second seal member 7 includes a gelatinous composition having a rectangular solid shape. The gelatinous composition is deformed by the force applied thereto to be expandable in all directions. For this reason, the gelatinous composition can follow a complicated shape to fill the gap.

The seal structure 15 includes the loop gasket 8 as an example of a third seal member. The loop gasket 8 may be made of rubber. However, the loop gasket 8 according to the present embodiment is made of elastomer. The loop gasket 8 is fitted in the groove 2a provided in the first case 2 to be attached thereto. The first and second cases 2 and 3 are jointed to arrange the loop gasket 8 therebetween. The loop gasket 8 comes into close contact with the smooth joining surface 3b provided in the second case 3, and the second seal member 7 is pushed by a portion 8a illustrated in FIG. 1. The loop gasket 8 according to the present embodiment has a higher degree of hardness than that of the second seal member 7. For this reason, the second seal member 7 is pushed by the loop gasket 8, thereby deforming adequately the second seal member 7. The loop gasket 8 deforms the second seal member 7, and has a function for ensuring the seal characteristics of the whole periphery of the housing 1.

Next, a description will be given of a relationship between a width W1 of the double-stick tape 4 and a width W2 of the flat cable 6, with reference to FIG. 6. As illustrated in FIG. 6, the width W1 of the double-stick tape 4 is greater than the width W2 of the flat cable 6. That is, W1>W2 is established. This defines a step between the flat cable 6 and the double-stick tape 4.

A description will be given of a seal method with the seal structure 15 mentioned above with reference to FIGS. 6 to 8C. FIGS. 6 and 8A to 8C are views of the seal structure when viewed in a direction of an arrow 10.

First, there is prepared the second case 3 provided at the joining surface 3b abutting the first case 2, with the recess portion 3a through which the flat cable 6 passes. The double-stick tape 4 adheres on the bottom surface 3a1 of the recess portion 3a. After that, the printed circuit board 5 connected with the flat cable 6 is housed within the second case 3. At this time, the double-stick tape 4 adheres to the flat cable 6. In such a way, the flat cable 6 is fixed on the bottom surface 3a1 of the recess portion 3a, thereby suppressing the decrease in the seal characteristics caused by the movement of the flat cable 6. That is, this can prevent opening of the seal portion caused by the movement of the flat cable 6. The printed circuit board 5 is installed with connected to the flat cable 6. This eliminates the need for the connection between the flat cable 6 and the printed circuit board 5 after the flat cable 6 is arranged within the recess portion 3a. Further, the hours of work can be reduced by using the double-stick tape 4, as compared with a case where bonding is employed as the first seal member. That is, in the case where the bond is used, it is necessary of the drying time for the bond. However, the double-stick tape 4 eliminates such a drying time. Furthermore, the double-stick tape 4 has an approximately uniform thickness, thereby easily maintaining the parallelism of the mounting surface of the flat cable 6 and the bottom surface 3a1.

After the double-stick tape 4 adheres to the flat cable 6, the second seal member 7 is arranged to cover the flat cable 6. Next, the loop gasket 8 is arranged between the first and second cases 2 and 3. Specifically, the loop gasket 8 is attached to the groove 2a of the first case 2 to abut the joining surface 3b of the second case 3 and the second seal member 7.

Figure 8A:
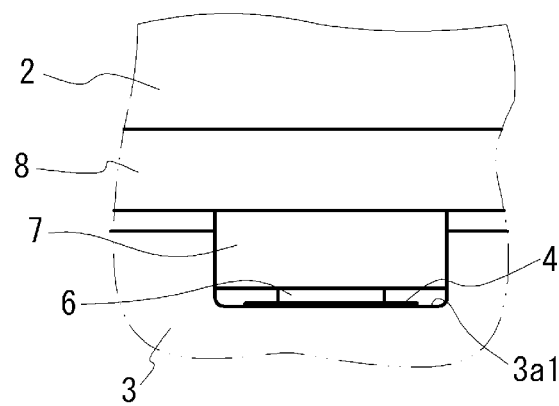
FIG. 8A through C are views of an example of a method of assembling process of the seal structure according to the embodiment.
Figure 8B:
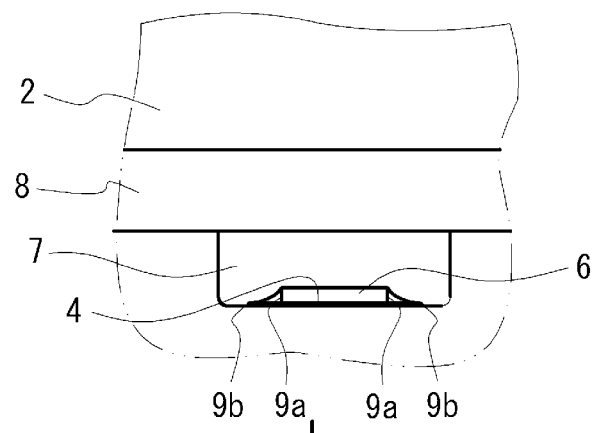

The above-described processes achieve the state illustrated in FIGS. 6, 7, and 8A. From this state, the second seal member 7 is pushed by the loop gasket 8. FIG. 8B is a schematic view of a process of the loop gasket 8 pushing the second seal member 7. The second seal member 7 pushed by the loop gasket 8 is deformed to fill the recess portion 3a. At this time, the second seal member 7 gradually fills regions 9a and 9b illustrated in FIG. 8B, thereby ensuring good seal characteristics. Herein, the region 9a corresponds to a step defined by making the width W1 of the double-stick tape 4 greater than the width W2 of the flat cable 6. The region 9b corresponds to a step defined between the bottom surface 3a1 and the double-stick tape 4 by the thickness of the double-stick tape 4. When the step is lower, the gelatinous composition is easily deformed. According to the present embodiment, the number of steps increases and the height per one step is lower. For this reason, the second seal member 7 is deformed corresponding to the shape of the stepped portion located within the recess portion 3a, thereby ensuring a hermetically-sealed state therein.

Figure 8C:
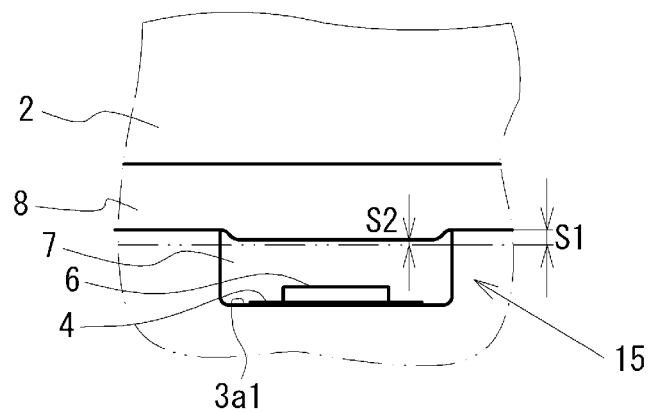

The first and second cases 2 and 3 are integrally jointed by engageable hooks or screws to define the housing 1. FIG. 8C is a view of the seal structure 15 accomplished by jointing the first and second cases 2 and 3. As illustrated in FIG. 8C, the second seal member 7 ensures the seal characteristics in the whole area of the recess portion 3a.

In the drawing, 51 indicates a deformation volume of the loop gasket 8 deformed by the joining surface 3b of the second case 3. S2 indicates a deformation volume of the loop gasket 8 deformed by pushing the second seal member 7. Thus, a deformation volume of the loop gasket 8 is changed depending on an object to be pushed to the loop gasket 8. Here, it is preferable that the whole loop gasket 8 receives a uniform pressure force. Thus, in order for the whole loop gasket 8 to receive a uniform pressure force, the shape of the loop gasket 8 may be changed.

Figure 9:
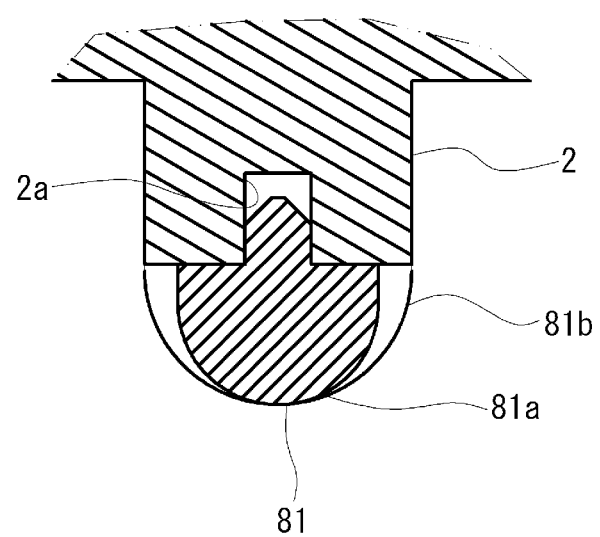
FIG. 9 is an explanatory view of an example of a shape of a loop gasket.
Figure 10:
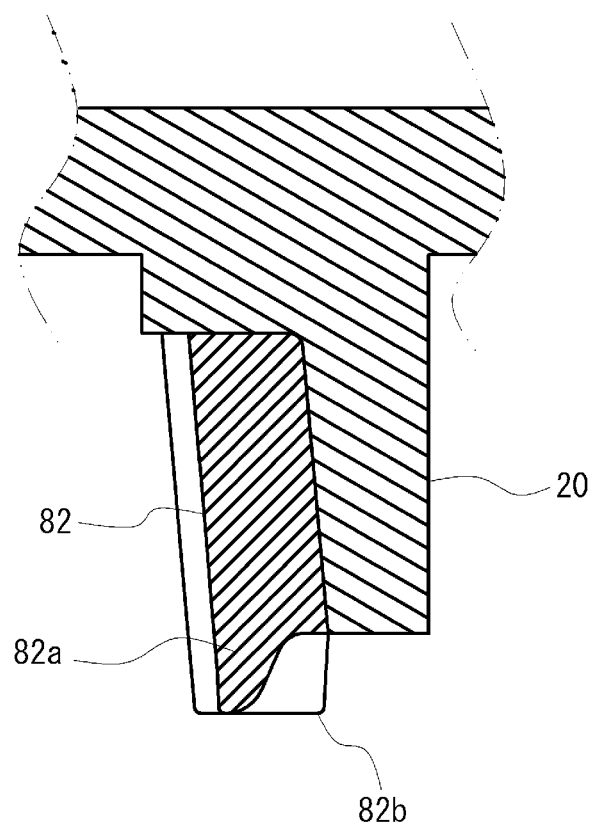
FIG. 10 is an explanatory view of an example of a shape of the loop gasket.

For example, a loop gasket 81, illustrated in FIG. 9, is provided with an expanding portion 81b wider than a normal width portion 81a. The normal width portion 81a is a portion abutable with the joining surface 3b of the second case 3. The expanding portion 81b is arranged in such a position as to face the second seal member 7. The position facing the second seal member 7 corresponds to the portion 8a illustrated in FIG. 1. In order to oppose a repulsive force of the second seal member 7, a cross-section area of the part receiving the repulsive force is set to be large. Even when a loop gasket 82 and a first case 20 are integrally provided as illustrated in FIG. 10, a normal width portion 82a and the expanding portion 82b can be provided in a similar manner. In this way, the shape of the loop gasket can be changed to ensure a desired pressure force state.

Figure 11A:
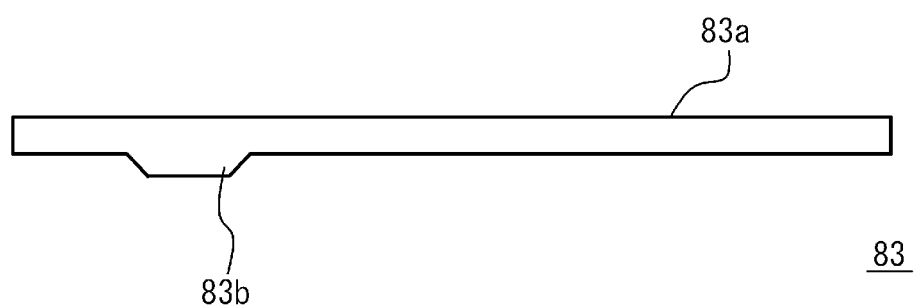
FIGS. 11A and 11B are explanatory views of an example of a shape of the loop gasket.
Figure 11B:
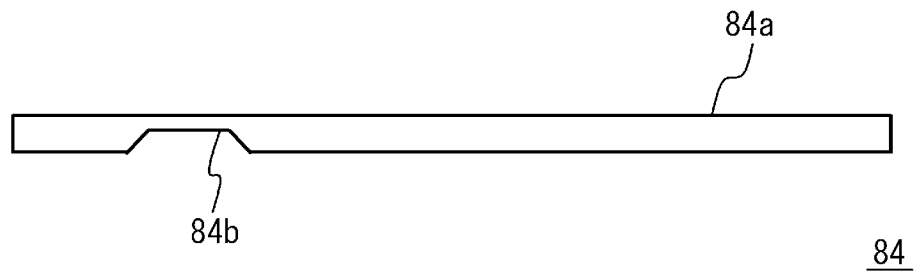

Moreover, the shape of the loop gasket may be changed into the shapes of loop gaskets 83 and 84 respectively illustrated in FIGS. 11A and 11B. That is, the position facing the second seal member 7 may be provided with a projection portion 83b which is thicker than a normal thickness portion 83a and which protrudes to the second seal member 7 side, as illustrated in FIG. 11A. Additionally, the position facing the second seal member 7 may be provided with a recess portion 84b thinner than a normal thickness portion 84a, as illustrated in FIG. 11B. Thus, the shape of the loop gasket can be changed in various ways. At this time, the shape of the loop gasket is changed to ensure suitable seal characteristics in light of various kinds of conditions such as a material of the loop gasket, and the shape and volume of the second seal member 7.

Figure 12:
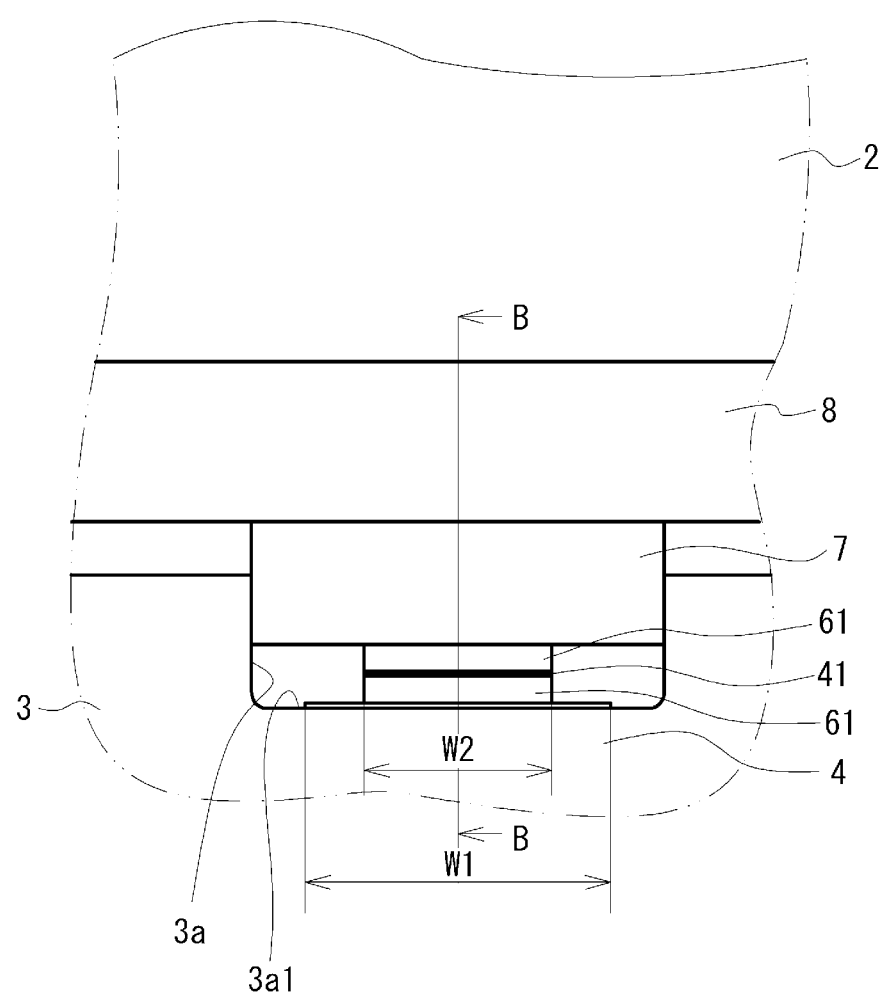
FIG. 12 is an explanatory view of a relationship between elements included in a seal structure according to another embodiment.
Figure 13:
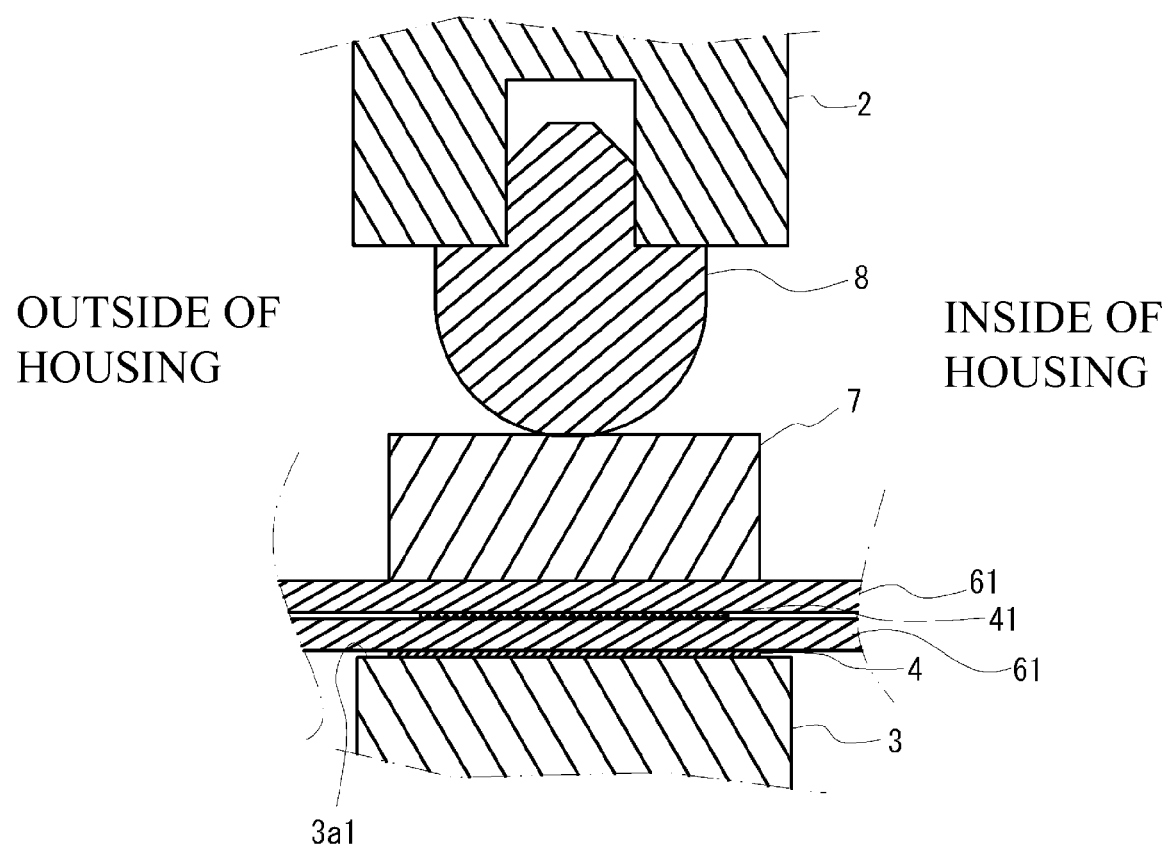
FIG. 13 is a cross-sectional view taken along line B-B of FIG. 12.

In the seal structure described herein, the second seal member 7 fills the recess portion 3a, thereby ensuring the seal characteristics, even in a case where the thickness of the flat cable 6 is increased. Further, the seal characteristics can be suitably ensured even in a case where another signal line is used instead of the flat cable 6. Furthermore, the seal characteristics can be suitably ensured even in a case where plural flat cables 61 are stacked as illustrated in FIGS. 12 and 13. Additionally, when the plural flat cables 61 are stacked as illustrated in FIGS. 12 and 13, a double-stick tape 41 is arranged between the flat cables 61. A base material of the double-stick tape 41 is discontinuous foam similar to that of the double-stick tape 4. This can ensure the seal characteristics in the stacked portion.

Figure 15:
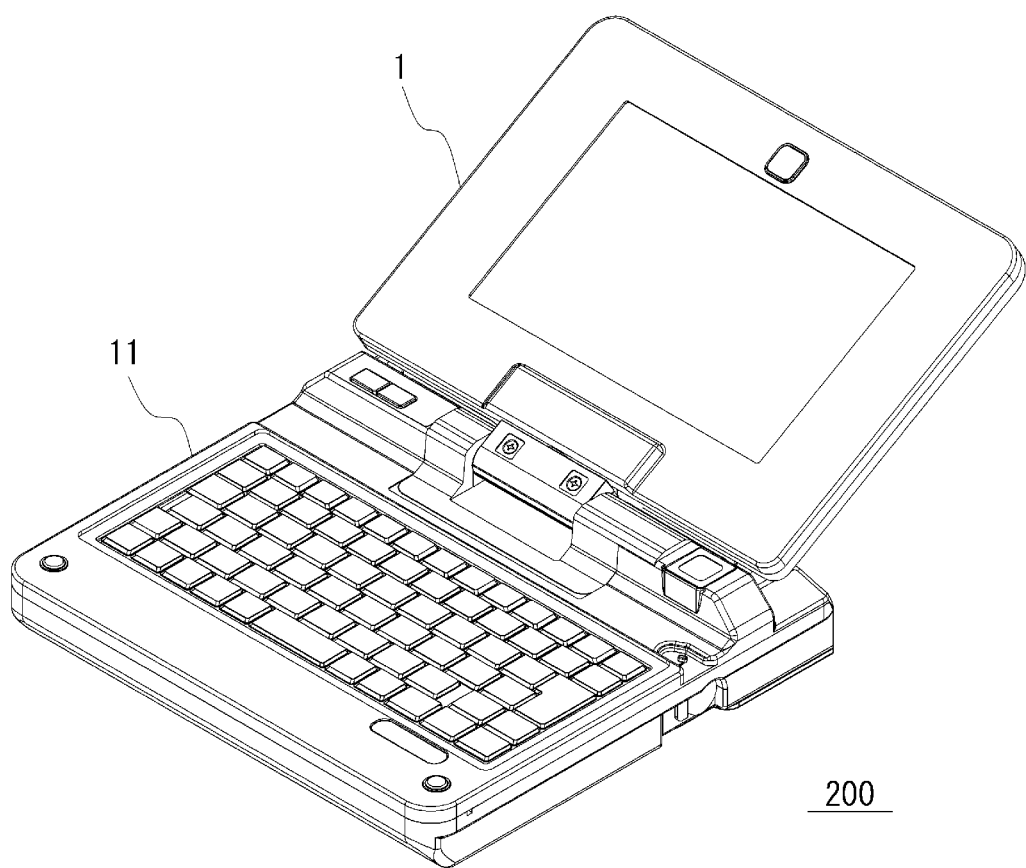
FIG. 15 is a perspective view of a notebook personal computer.

The seal structure 15 described above can be employed in the portable telephone 100 illustrated in FIG. 14. The portable telephone 100 is an example of an electronic device or a portable device. The portable telephone 100 includes the housing 1 and the other housing 11, and the flat cable 6 connects therebetween. The seal structure 15 can be used for a notebook personal computer 200 as illustrated in FIG. 15.

The notebook personal computer 200 includes a housing 1 provided with a display and the other housing 11 provided with a keyboard. The housings 1 and 11 are connected through the flat cable 6. Thus, the seal structure 15 can be used for various kinds of electronic devices and portable devices. The seal structure 15 can be used for a Personal Digital Assistant (PDA).

In the seal structure described herein, the seal member and the signal line are stacked with each other to be jointed, thereby easily ensuring the seal characteristics. That is, this can simplify manufacturing processes. For example, it is not necessary to perform the special process of integrating the signal line and rubber or elastomer. Further, it is not necessary of providing a housing with a hole through which the signal line passes. In other words, the first and second cases, and the first, second, and third seal members may be separately provided. Consequently, there is no need for any special manufacturing technologies and facilities, thereby reducing manufacturing cost.

For example, the recess portion through which the signal line passes may be provided in the first case. Further, the second seal member may include a material which is deformed by a force applied thereto, and the material then expands in all directions so as to correspond to a complicated shape to fill a gap, regardless of a so-called gelatinous composition.

All examples and conditional language recited herein are intended for pedagogical purposes to aid the reader in understanding the invention and the concepts contributed by the inventor to furthering the art, and are to be constructed as being without limitation to such specifically recited examples and conditions, nor does the organization of such examples in the specification relate to a showing of the superiority and inferiority of the invention. Although the embodiment of the present inventions has been described in detail, it should be understood that the various changes, substitutions, and alterations could be made hereto without departing from the sprit and scope of the invention.

What is claimed is:

1. A seal structure sealing a housing for passing a signal line therethrough, the seal structure comprising:
    a first case;
    a second case joined to the first case to define the housing, and provided with a recess portion through which the signal line passes at a joining surface joining the first case;
    a first seal member having size so as to be located in the recess portion, arranged on a bottom surface of the recess portion, and mounting the signal line;
    a second seal member having size so as to be located in the recess portion, including a gelatinous composition arranged in the recess portion to cover the signal line arranged on the first seal member; and
    a third seal member between the first and second cases, and including a normal width portion and an expanding portion, the normal width portion facing the joining surface, the expanding portion being wider than the normal width portion, the expanding portion facing and pushing the second seal member.

2. The seal structure of claim 1, wherein a degree of hardness of the third seal member is higher than that of the second seal member.

3. The seal structure of claim 1, wherein the first seal member is discontinuous foam or includes discontinuous foam.

4. The seal structure of claim 1, wherein front and rear surfaces of the first seal member are respectively provided with adhesive layers.

5. The seal structure of claim 1, wherein the first seal member includes a width greater than a width of the signal line.

6. The seal structure of claim 1, wherein the third seal member includes a portion, facing the second seal member, different in thickness from the normal thickness portion.

7. An electronic device comprising an seal structure sealing a housing for passing a signal line therethrough, the seal structure comprising:
    a first case;
    a second case joined to the first case to define the housing, and provided with a recess portion through which the signal line passes at a joining surface joining the first case;
    a first seal member having size so as to be located in the recess portion, arranged on a bottom surface of the recess portion, and mounting the signal line;
    a second seal member having size so as to be located in the recess portion, including a gelatinous composition arranged in the recess portion to cover the signal line arranged on the first seal member; and
    a third seal member between the first and second cases, and including a normal width portion and an expanding portion, the normal width portion facing the joining surface, the expanding portion being wider than the normal width portion, the expanding portion facing and pushing the second seal member.

8. A portable device comprising an seal structure sealing a housing for passing a signal line therethrough, the seal structure comprising:
- a first case;
- a second case joined to the first case to define the housing, and provided with a recess portion through which the signal line passes at a joining surface joining the first case;
- a first seal member having size so as to be located in the recess portion, arranged on a bottom surface of the recess portion, and mounting the signal line;
- a second seal member having size so as to be located in the recess portion, including a gelatinous composition arranged in the recess portion to cover the signal line arranged on the first seal member; and
- a third seal member between the first and second cases, and including a normal width portion and an expanding portion, the normal width portion facing the joining surface, the expanding portion being wider than the normal width portion, the expanding portion facing and pushing the second seal member.

* * * * *